(12) United States Patent
Schroeder et al.

(10) Patent No.: US 6,914,837 B2
(45) Date of Patent: Jul. 5, 2005

(54) DRAM MEMORY WITH A SHARED SENSE AMPLIFIER STRUCTURE

(75) Inventors: Stephan Schroeder, Munich (DE); Manfred Proell, Dorfen (DE); Aurel Von Campenhausen, Munich (DE); Marcin Gnat, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/761,242

(22) Filed: Jan. 22, 2004

(65) Prior Publication Data

US 2004/0208073 A1 Oct. 21, 2004

(30) Foreign Application Priority Data

Jan. 23, 2003 (DE) .......................................... 103 02 649

(51) Int. Cl.[7] .................................................. G11C 7/00
(52) U.S. Cl. ........................ 365/205; 365/207; 365/208; 365/230.03
(58) Field of Search ................................ 365/190, 205, 365/207, 208, 230.03

(56) References Cited

U.S. PATENT DOCUMENTS

| 5,016,224 A | * | 5/1991 | Tanaka et al. | ......... 365/230.03 |
| 6,377,504 B1 | * | 4/2002 | Hilbert | .................. 365/230.03 |
| 6,449,182 B1 | | 9/2002 | Ooishi | |

FOREIGN PATENT DOCUMENTS

EP  0 892 409 A2  1/1999

* cited by examiner

*Primary Examiner*—Son Mai
(74) *Attorney, Agent, or Firm*—Slater & Matsil, L.L.P.

(57) ABSTRACT

A RAM memory with a shared sense amplifier structure, in which sense amplifiers are arranged in strips between two adjacent cell blocks and are configured as differential amplifiers. In an exemplary embodiment, a one of four bit line pairs of the two adjacent cell blocks can be selected for connection to a sense amplifier at any one time using respective isolation transistor pairs, in response to a connection control signal fed to the latter. A signal sent on a word line coupled to a memory cell associated with the selected bit line pair, provides access to the memory cell by the sense amplifier.

20 Claims, 3 Drawing Sheets

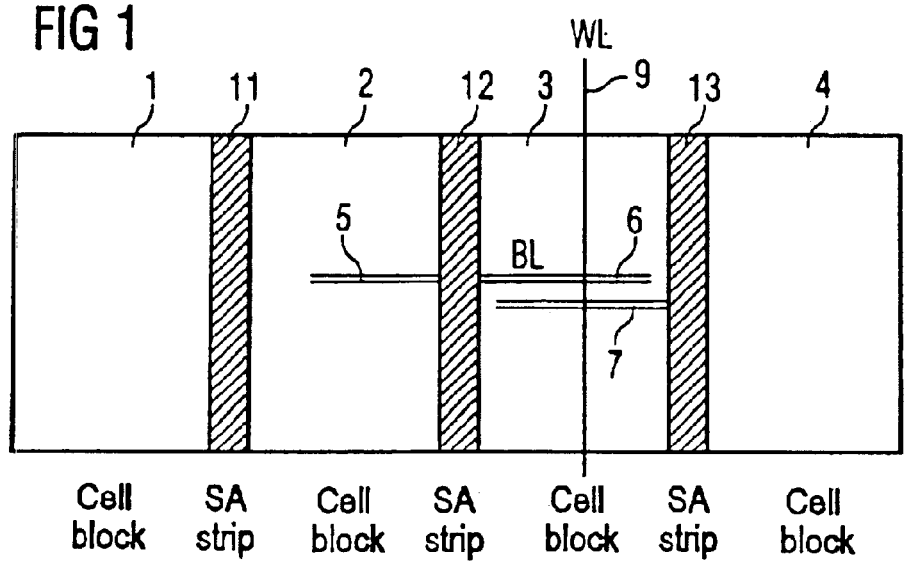
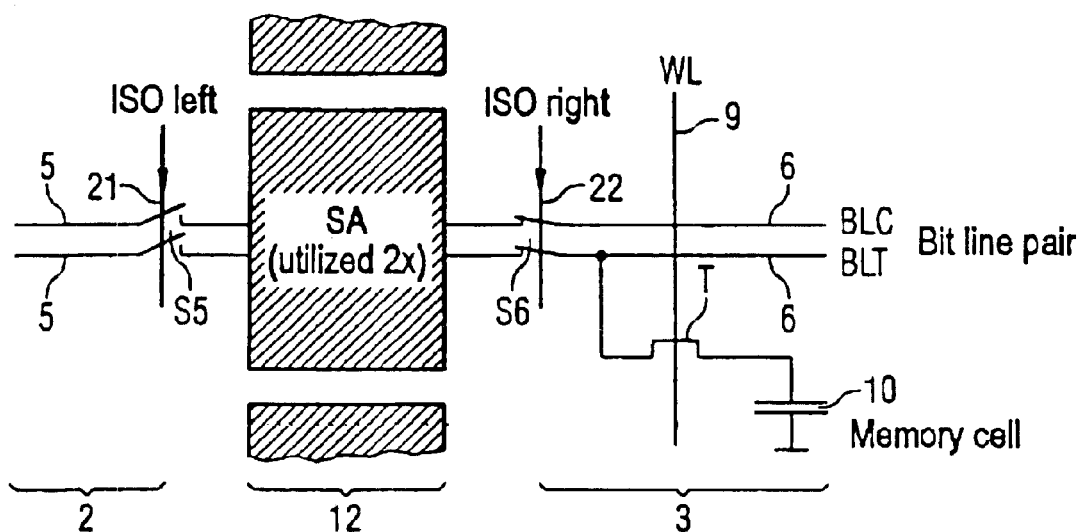

DRAM MEMORY WITH A SHARED SENSE AMPLIFIER STRUCTURE

FIELD OF THE INVENTION

The present invention relates to a semiconductor memory. In particular, it relates to a RAM memory with a shared SA structure, in which sense amplifiers which are arranged in SA strips between adjacent cell blocks.

BACKGROUND INFORMATION

DRAM semiconductor memories are configured as arrays, in which rows correspond to word lines and columns correspond to bit lines. During memory access, a word line is activated in an initial operation, such that memory cells arranged in an activated row are electrically connected to a bit line. The bit line leads to a sense amplifier (SA), which detects and amplifies the cell signal transmitted via the bit line. An amplified signal is written back to the cell or it can be read out externally.

In order to achieve an arrangement of the cell array that is as compact as possible, it is desirable to construct bit lines to be as long as possible. However, this unfortunately leads to a reduction of the signal to be detected by the sense amplifier.

The accompanying FIG. 1 illustrates a known division of a memory cell array in a DRAM into individual blocks 1, 2, 3, and 4. The sense amplifiers are situated in so-called "SA strips" 11, 12, and 13 located between two adjacent cell blocks. In order to save space, a sense amplifier lying in an SA strip, for example 12, between two adjacent cell blocks 2 and 3, is used jointly either for bit line (BL) 5 coming from the left-hand cell block 2 or for bit line 6, coming from right-hand cell block 3. When communicating to sense amp 12, either bit line 5 or bit line 6 is connected to an activated word line WL. For simplification, FIG. 1 shows only a single word line 9 in cell array 3. This arrangement is generally referred to as a "shared SA structure".

FIG. 2 illustrates further details of such a known shared SA structure, in which a sense amplifier SA is provided jointly for two bit lines 5 and 6 coming from a left-hand and right-hand cell block 2 and 3. It should be noted here that information signals traveling from and to the memory cells are passed in the form of differential signals on complementary bit lines BLT and BLC. Such complementary bit lines are referred to as a bit line pair. For simplification, the illustration of a memory cell attached to the bit line pair shows only a storage capacitor 10 and an associated selection transistor T. Selection transistor T is activated by a word line signal WL via word line 9. Each bit line pair that is allocated to a common sense amplifier is provided with isolation and connection switches S5 and S6, the switching states of which are set by connection control signal ISO left, via a first line 21, and ISO right via a second line 22, respectively.

European Patent No. EP 0 892 409 A2 describes a semiconductor memory (cf. FIG. 10 of the patent, enclosed herein and labeled as FIG. 3), in which four bit line pairs from two adjacent cell blocks can be connected to each sense amplifier (for example SA0, SA1, A2). The description with regard to FIG. 3 from the patent reveals that the bit line pairs that can be connected from a cell block to the respective sense amplifier, as far as the content of the memory cells is concerned, are not independent bit line pairs. Instead, each bit line and each complementary bit line, at the intermediate grounding point of a submatrix, is subdivided into two bit lines toward the right and two bit lines toward the left. Thus, for example, left-hand side bit line pair BL01 and BL01; complementary can be connected to sense amplifier SA0 and right-hand side bit line pair BL0R and BL0R; complementary can likewise be connected to sense amplifier SA0 by means of a line pair ML0, ML0; complementary routed in a connection layer lying above the bit lines. This concept is referred to as an "extended bit line system" in the document. Moreover, 128 sense amplifiers are used for, for example, 256 bit line pairs of a submatrix in each sense amplifier block.

SUMMARY

In embodiments of the present invention, the number of sense amplifiers required in total in a RAM memory is reduced still further, and a corresponding reduction of area in the integration of the sense amplifiers in the SA strip occurs.

An exemplary embodiment of the present invention is characterized by an arrangement of sense amplifiers, wherein a sense amplifier is arranged jointly for four bit line pairs of two adjacent cell blocks, so that it is possible for each of the bit line pairs assigned to a respective sense amplifier to be connected to a different memory cell in the respective cell block by means of word line signals fed via a common word line.

A RAM memory is disclosed that comprises a shared SA structure that includes a plurality of SA strips, such that each strip is arranged between two memory cell blocks. Sense amplifiers (SA) within each strip are each coupled to four bit line pairs, two in each memory cell block, by use of a connection control signal operating on an isolation transistor pair for the purposes of connecting the SA to the bit line pair associated with the isolation transistor pair. Each bit line pair, in turn, is coupled to a memory cell in one of the two memory blocks through a word line signal sent along a word line connected to the memory cell. The word line is additionally coupled to a second memory cell associated with the second bit line pair of the memory cell block that is coupled to the SA. In the above manner, each of four memory cells, two of each located in each memory cell block, are accessible to the common SA.

In the case of a RAM memory constructed with the above features, not only the number of sense amplifiers but also the number of physical word lines is reduced by half.

The above and further advantageous features will become even clearer in the following description which explains an exemplary embodiment of a RAM memory according to the invention, if this description is read in relation to the accompanying drawing.

BRIEF DESCRIPTION OF THE DRAWINGS

FIG. 1 schematically depicts a memory cell array of a DRAM semiconductor memory divided into individual cell blocks with SA strips lying in between.

FIG. 2 illustrates details of a shared SA structure of a DRAM semiconductor memory in accordance with FIG. 1, in which memory a sense amplifier is utilized jointly by two bit line pairs of two adjacent cell blocks.

DETAILED DESCRIPTION OF THE PREFERRED EMBODIMENTS

Figure 3:
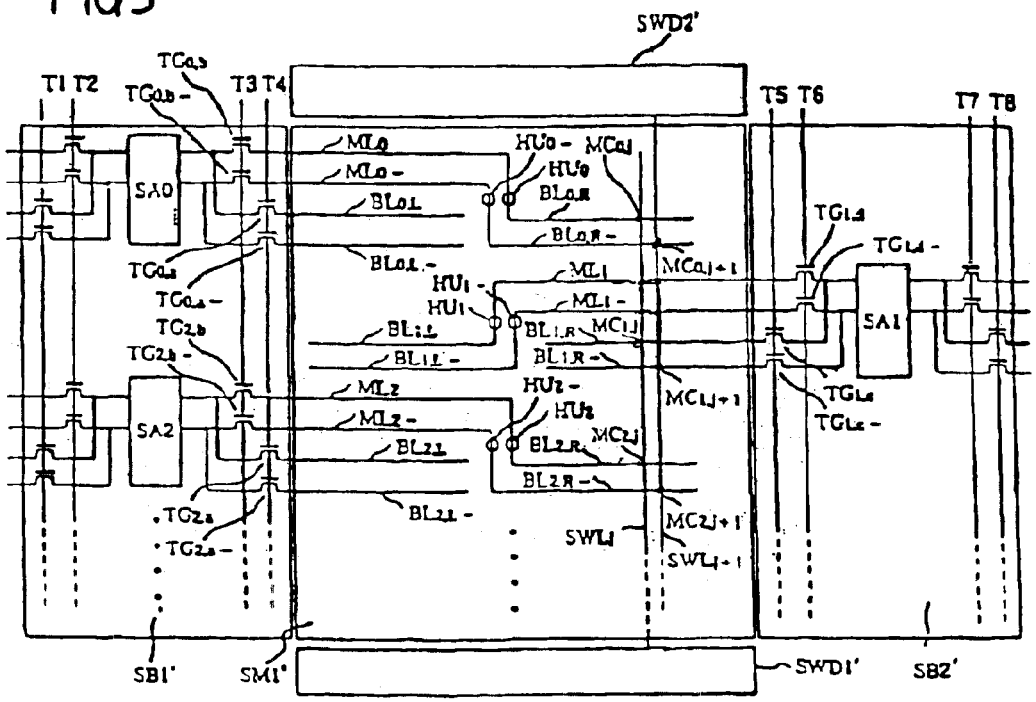
FIG. 3 depicts a known extended bit line system memory.

The following list of symbols is used consistently throughout the text and drawings.

| List of reference symbols | |
|---|---|
| 1–4 | Cell blocks |
| 5–7, 51, 52, 61, 62 | Bit line pairs |
| 9 | Word line |
| 10, 101, 102 | Memory cell |
| 21, 22 | Connection control signal line |
| S5, S6 | Switch pairs |
| T, $T_1$, $T_2$ | Selection transistor |
| T51, T52, T61, T62 | Isolation transistor pairs |
| SA | Sense amplifier |
| SE | Control device |
| BLT | Bit line true |
| BLC | Bit line complementary |
| WL | Word line |

The following description relates to a memory architecture that, among other advantages, achieves a more compact design. In an embodiment of the present invention, a memory is characterized by an increased amount of bit line pairs connected to a common sense amplifier.

As one exemplary manner of accomplishing this, a pair of memory cells located in the same cell block and assigned to the same SA, share a common word line. The word line is in communication with a first and a second bit line pair using a first and a second selection transistor, respectively. The latter devices are configured in such a way that a word line signal at a first level on the common word line connects (selects) a first of two memory cells associated with the bit line pair, and isolates a second memory cell from its associated bit line pair, while a word line signal at a second, different level isolates the first memory cell from its associated bit line pair, and connects the second memory cell to its associated bit line pair.

The signals required for operating a RAM memory of this type are generated by a control device provided. In order to connect a bit line pair from the first and second bit line pair to the common sense amplifier during a connection interval (for example a read interval), the control device generates a word line signal and a connection control signal for the bit line pair either at a first level or at a second level, so that the connection control signal lies within the time interval of the word line signal. At the same time, the control device applies a center level to a connection control signal line leading to isolation transistor pairs that are associated with bit line pairs, residing in an adjacent cell block and assigned to the same sense amplifier. The center level results in deactivation of the connection control line of the adjacent cell block.

In an exemplary embodiment of the present invention, the signals required for operating the RAM memory are generated by a control device. In order to connect a bit line pair from the first and second bit line pair to the common sense amplifier during a connection interval, the device generates a word line signal and a connection control signal for the bit line pair either at a first level or at a second level, wherein the connection control signal lies within the time interval of the word line signal. At the same time, the control device applies a center level to a connection control signal line, leading to isolation transistor pairs associated with the bit line pairs which are assigned to the same sense amplifier.

Preferably, a first selection transistor is a PMOS transistor, while a second selection transistor is an NMOS transistor, wherein the first level of the word line signal may be a low level and the second level a high level.

Preferably a first pair and a second pair of isolation transistors are arranged for a first and second bit line pair, respectively, where the bit line pairs are assigned to the same sense amplifier and are located in the same cell block. A connection control signal at a first level, fed via a common connection control line, connects a first of the two bit line pairs to the common sense amplifier and isolates the second bit line pair from said sense amplifier, while a connection control signal at a second level on the same connection control signal line isolates the first bit line pair from the common sense amplifier and connects the second bit line pair to the common sense amplifier.

Preferably, a first isolation transistor pair comprises PMOS transistors and a second isolation transistor pair comprises NMOS transistors, in which case the first level of the connection control signal is a low level and the second level of the connection control signal is a high level.

Figure 4:
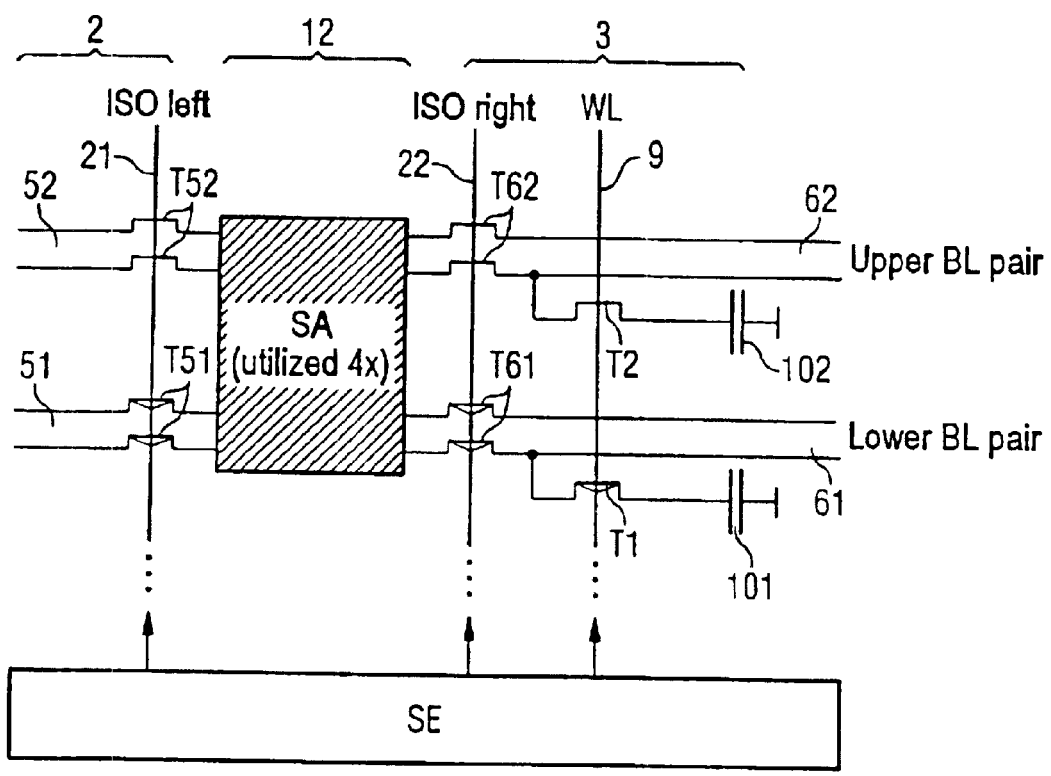
FIG. 4 schematically depicts an exemplary embodiment of a RAM memory in accordance with an embodiment of the present invention, including a shared SA structure in which a sense amplifier is utilized jointly by four bit line pairs.

FIG. 4 shows an exemplary embodiment of the present invention, wherein a sense amplifier SA is utilized in a fourfold manner. A lower bit line pair 61 and an upper line pair 62 are situated in a cell block designated by 3. A memory cell 101, depicted as a storage capacitor, is located at the lower bit line pair. The memory cell is connected to lower bit line pair 61 via a PMOS selection transistor T1 after the activation of a word line 9 by means of a word line signal WL. Similarly, a different memory cell 102 illustrated as a storage capacitance can be connected to upper bit line pair 62 by an NMOS selection transistor T2 that can be activated by the same word line 9. The isolation transistor pair T61 used for lower bit line pair 61 comprises PMOS transistors, and isolation transistor pair T62 for upper bit line pair 62 comprises NMOS transistors. Connection control signal line 22, which supplies a connection control signal ISO right, passes jointly to isolation transistor pairs T61 and T62.

In a similar manner, in response to a connection control signal ISO left fed via a common line 21, two bit line pairs 51 and 52 from an adjacent left-hand cell block 2, which also utilize SA 80, can be connected to SA 80 by an isolation transistor pair T51, comprising PMOS transistors, and an isolation transistor pair T52, comprising NMOS transistors, respectively.

A control device SE 90 is provided in order to generate the word line signal WL on line 9 and the connection control signals on lines 21 and 22 with the correct level and the correct temporal sequence.

The example below relates to a respective connection of memory cells 101 and 102 to SA 80, which is utilized in a fourfold manner via bit line pairs 61 and 62 from right-hand cell block 3.

In the deactivated state, both the word line signal WL on word line 9 and the connection control signal ISO left of the connection control signal line 21 residing in left hand cell block 2, are at a center level. Additionally, connection control signal ISO right on connection control signal line 22, in right hand cell block 3, is at a center level. All transistors T1, T2, T51, T52, T61 and T62 are then in an off state. With the activation of the word line signal WL on the line 9, a selection is made between lower bit line pair 61 and upper bit line pair 62, here, by way of example, from right-hand cell block 3. For the activation of lower bit line pair 61 and selection of lower memory cell 101, the word line signal WL on word line 9 is switched to a low level. The connection control signal ISO right on line 22 is likewise switched to a low level. PMOS transistors T1 and T61 are thus in the on state, while NMOS transistors T2 and T62 remain turned off. For activation of upper bit line pair 62 and selection of upper memory cell 102, a signal on the word line 9 and the connection control signal ISO right on connection control signal line 22 are switched to a high level. NMOS transistors T2 and T62 are then in the on state, resulting in upper bit line pair 62 becoming connected to sense amplifier SA, while PMOS transistors T1 and T61 of lower bit line pair 61 are turned off. In both cases, the connection control signal ISO left on signal line 21 of left-hand cell block 2 remains at the center level, so that isolation transistor pairs T51 and T52 are turned off.

For activation and selection of one of the two bit line pairs 51 and 52, and connection of the same to jointly utilized sense amplifier SA 80, a connection control signal ISO left and a word line signal on a word line (not shown in FIG. 4) of the left-hand cell block are generated in a corresponding manner by control device SE 90, indicated as a block in FIG. 4. FIG. 4 only illustrates the components and signals which are of importance for an embodiment of the present invention which a RAM memory contains a sense amplifier SA utilized in a fourfold manner. Further components such as local data lines, equalize switches and so on are unimportant for this invention and are therefore not shown in FIG. 4.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A RAM memory with a shared SA structure, comprising:
   a plurality of sense amplifiers configured as differential amplifiers and arranged in SA strips, each between adjacent memory cell blocks; and
   isolation transistor pairs for connecting sense amplifiers and at least one of a plurality of bit line pairs of respective adjacent memory cell blocks in response to a connection control signal;
   wherein the sense amplifiers are arranged in each case jointly for at least four bit line pairs of the adjacent memory cell blocks, such that each of the bit line pairs is assignable to a respective sense amplifier to be connected to a different memory cell in the respective cell block by means of word line signals fed via a common word line.

2. The RAM memory as in claim 1, wherein a first and a second memory cell sharing a common word line, and connected to a first and second bit line pair, respectively, each assigned to the same sense amplifier of the same cell block, in each case have a first and second selection transistor, are provided such that a word line signal of a first level on the common word line selects a first of the two memory cells and connects it to the bit line pair associated with it, and isolates the second memory cell from the bit line pair associated with it and a word line signal of a second, different level on the same word line isolates the first memory cell from the bit line pair associated with it and connects the other memory cell to the bit line pair associated with it.

3. The RAM memory in claim 2, wherein the first selection transistor is a PMOS transistor and the second selection transistor is an NMOS transistor and the first level of the word line signal is a low level and the second level of the word line signal is a high level.

4. The RAM memory as claimed in claim 1, wherein a first and second isolation transistor pair of the same cell block are in each case set up for a first and second bit line pair assigned to the same sense amplifier, wherein a connection control signal set at a first level fed to them via a common connection control signal line, connects the first of the two bit line pairs to the same sense amplifier and isolates the second bit line pair from said sense amplifier, and a connection control signal set at a second level on the same connection control signal line isolates the first bit line pair from the same sense amplifier and connects the second bit line pair to the common sense amplifier.

5. The RAM memory in claim 1, wherein the first isolation transistor pair comprises PMOS transistors and the second isolation transistor pair comprises NMOS transistors and the first level of the connection control signal is a low level and the second level of the connection control signal is a high level.

6. The RAM memory as claimed in claim 2, further comprising a control device for connecting a bit line pair selected from the first and second bit line pair of the same cell block to the common sense amplifier in a connection interval, wherein the control device generates the word line signal on the associated word line and the connection control signal for said bit line pair on the associated connection control signal line, wherein the connection control signal lies within the time interval of the word line signal and, during the same time interval, applies a center level to the connection control signal line leading to the isolation transistor pairs of the bit line pairs of the adjacent cell block that are assigned to the same sense amplifier—, which center level deactivates said line.

7. A RAM memory with a shared sense amplifier structure comprising:
   a sense amplifier strip containing a plurality of sense amplifiers, wherein the sense amplifier strip is deposed between, and in communication with, a first and a second cell block;
   a first connection control signal line residing in the first cell block;
   a second connection control line residing in the second cell block;
   a first word line, residing in the first cell block and coupled to a first and a second memory cell;
   a second word line, residing in the second cell block, and coupled to a third and a fourth memory cell;
   a first bit line pair residing in the first cell block and coupled to the first connection control signal line;
   a second bit line pair residing in the first cell block and coupled to the first connection control signal line;

a third bit line pair residing in the second cell block and coupled to the second connection control signal line; and a fourth bit line pair residing in the second block and coupled to the second connection control signal line, wherein, at any one instant, a single pair of the first, second, third or fourth bit line pairs can be connected to a common sense amplifier residing in the sense amplifier strip.

8. The memory of claim 7, wherein the sense amplifiers residing in the sense amplifier strip are configured as differential amplifiers.

9. The RAM memory of claim 8, further comprising:

a first selection transistor coupled to the first word line and the first memory cell; and a second selection transistor coupled to the first word line and the second memory cell, wherein a signal on the first word line set at a first level connects the first cell to the first bit line pair, and wherein the signal on the first word line set at a first level isolates the second memory cell from the second bit line pair.

10. The RAM memory of claim 9, wherein a signal on the first word line set at a second level isolates the first cell from the first bit line pair, and wherein a signal on the first word line set at a second level connects the second memory cell to the second bit line pair.

11. The RAM memory of claim 9, further comprising:

a third selection transistor coupled to the second word line and the third memory cell; and a fourth selection transistor coupled to the second word line and the fourth memory cell, wherein a signal on the second word line set at a first level connects the third cell to the third bit line pair, and wherein a signal on the second word line set at a first level isolates the fourth memory cell from the fourth bit line pair.

12. The RAM memory of claim 11, wherein a signal on the second word line set at a second level isolates the third cell from the third bit line pair, and wherein a signal on the second word line set at a second level connects the fourth memory cell to the fourth bit line pair.

13. The RAM memory as claimed in claim 12, wherein the first and third selection transistors are PMOS transistors and the second and fourth selection transistors are NMOS transistors, and wherein the first level is a low level and the second level is a high level.

14. The RAM memory of claim 8, further comprising:

a first pair of isolation transistors coupled to the first connection control signal line; and a second pair of isolation transistors coupled to the first connection control signal line, wherein a signal on the connection control signal line set at a first level connects the first bit line pair to the common sense amplifier, and wherein a signal on the first connection control signal line set at a first level isolates the second bit line pair from the common sense amplifier.

15. The RAM memory of claim 14, wherein a signal on the first connection control signal line set at a second level isolates the first bit line pair from the common sense amplifier, and wherein a signal on the first connection control signal line set at second level connects the second bit line pair to the common sense amplifier.

16. The RAM memory of claim 14, further comprising:

a third pair of isolation transistors coupled to the second connection control signal line; and a fourth pair of isolation transistors coupled to the second connection control signal line, wherein a signal on the second connection control signal line set at a first level connects the third bit line pair to the common sense amplifier, and wherein a signal on the second connection control signal line set at a first level isolates the fourth bit line pair from the common sense amplifier.

17. The RAM memory of claim 16, wherein a signal on the second connection control signal line set at a second level isolates the third bit line pair from the common sense amplifier, and wherein a signal on the second connection control signal line set at a second level connects the fourth bit line pair to the common sense amplifier.

18. The RAM memory of claim 17, wherein the first and third isolation transistor pairs are PMOS transistors and the second and fourth isolation transistor pairs are NMOS transistors, and wherein the first level of the connection control signal is a low level and the second level of the connection control signal is a high level.

19. The RAM memory of claim 8, further comprising a control device, wherein the control device is coupled to the first word line, the second word line, the first connection control signal line, and the second connection control signal line.

20. The RAM memory of claim 19, wherein the control device generates a word line signal on the first word line and a connection control signal on the first connection control signal line, and wherein the connection control signal lies within the time interval of the word line signal, and wherein, during the same time interval, the control device applies a center level to the second connection control signal line, wherein the center level deactivates the second connection control signal line, whereby a bit line pair chosen from the first and second bit line pair is connected to the common sense amplifier during a connection interval.

* * * * *